(12) United States Patent
Yamaguchi

(10) Patent No.: US 8,760,130 B2
(45) Date of Patent: Jun. 24, 2014

(54) ELECTRONIC APPARATUS AND POWER SUPPLY DEVICE THAT SWITCH BETWEEN ON-STATE AND OFF-STATE

(75) Inventor: Hideaki Yamaguchi, Susono (JP)

(73) Assignee: Canon Kabushiki Kaisha

( * ) Notice: Subject to any disclaimer, the term of this patent is extended or adjusted under 35 U.S.C. 154(b) by 166 days.

(21) Appl. No.: 13/014,675

(22) Filed: Jan. 26, 2011

(65) Prior Publication Data

US 2011/0187440 A1 Aug. 4, 2011

(30) Foreign Application Priority Data

Jan. 29, 2010 (JP) .................................. 2010-018808

(51) Int. Cl.
*G05F 1/00* (2006.01)
(52) U.S. Cl.
USPC .......................................................... 323/265
(58) Field of Classification Search
USPC ................. 323/220, 226, 265, 266, 273, 299; 363/34, 74, 123
See application file for complete search history.

(56) References Cited

U.S. PATENT DOCUMENTS

| | | | |
|---|---|---|---|
| 6,058,034 A * | 5/2000 | Cummings et al. ............. | 363/74 |
| 6,198,262 B1 * | 3/2001 | Squibb et al. ................. | 323/273 |
| 7,545,652 B2 | 6/2009 | Yamaguchi .................... | 361/778 |
| 7,916,497 B2 | 3/2011 | Yamaguchi .................... | 361/778 |
| 8,203,727 B2 | 6/2012 | Koizumi | |
| 8,315,534 B2 * | 11/2012 | Yano et al. ...................... | 399/88 |
| 2009/0179626 A1 * | 7/2009 | Smith et al. ................... | 323/299 |

FOREIGN PATENT DOCUMENTS

| | | |
|---|---|---|
| JP | 3010775 U | 5/1995 |
| JP | 2000-350360 | 12/2000 |
| JP | 2003-076450 A | 3/2003 |
| JP | 2005-285041 | 10/2005 |
| JP | 2006-295902 A | 10/2006 |
| JP | 2007-090739 | 4/2007 |
| JP | 2008-187871 | 8/2008 |

* cited by examiner

*Primary Examiner* — Adolf Berhane
*Assistant Examiner* — Yemane Mehari
(74) *Attorney, Agent, or Firm* — Fitzpatrick, Cella, Harper & Scinto

(57) ABSTRACT

The electronic apparatus includes a direct-current voltage generation part that generates a direct-current voltage from a commercial power supply; a switching part that switches between an on-state in which the direct-current voltage from the direct-current voltage generation part is output, and an off-state in which the output of the direct-current voltage is shut down, a control part that controls operation of the direct-current voltage generation part; and a power supply maintaining part connected to the direct-current voltage generation part, the power supply maintaining part instructing the switching part to be in the on-state or the off-state, and consequently, enables provision of a soft-switch electronic apparatus that after recovery of a power failure, automatically returns to a state before occurrence of the power failure.

8 Claims, 9 Drawing Sheets

ELECTRONIC APPARATUS AND POWER SUPPLY DEVICE THAT SWITCH BETWEEN ON-STATE AND OFF-STATE

BACKGROUND OF THE INVENTION

1. Field of the Invention

The present invention relates to a restart of an electronic apparatus upon recovery from a power failure.

2. Description of the Related Art

Conventionally, some of electronic apparatuses such as image forming apparatuses, which form an image on a recording material, and personal computers, incorporate a soft-switch power supply device therein. In such an electronic apparatus, when a user performs a power-off operation, control can be performed so that the power supply is stopped not immediately but after predetermined processing is performed, or remote control can be performed to turn on/off a main power supply of the electronic apparatus from a place away from the apparatus. Also, for a power supply switch for such an electronic apparatus, a rocker switch that maintains an on/off-state is not used, but an automatic-return momentary switch that comes into an on-state only during the switch being depressed, and returns to an off-state when the switch is released.

FIG. 9 is a block diagram illustrating a configuration of an image forming apparatus with a momentary switch employed therein, in which a conventional soft-switch power supply device is incorporated. An operation for starting an image forming apparatus when the power supply is turned on and an operation for shutting down the image forming apparatus when the power supply is turned off will be described with reference to FIG. 9.

Upon power being supplied to an image forming apparatus A from a commercial power supply B, an AC/DC converter 15 in a power supply device 10 is activated and generates a voltage source V1 (for example, +3.3 V). The voltage source V1 supplies power only to a switch SW1 in an operation part 13 and does not supply power to the other electrical components, and thus, only with the power supply from the voltage source V1, the image forming apparatus A remains in a nonoperating state.

Next, upon a user depressing the switch SW1 in the operation part 13 to make the image forming apparatus A operate, the voltage source V1 is applied to a capacitor C3 via a resistor R7, the capacitor C3 being charged with power.

Upon the capacitor C3 being charged with power, a base current flows in a transistor Tr3, turning the transistor Tr3 on. Upon the transistor Tr3 being turned on, a potential of a gate of the transistor Tr1 transitions to a ground level, making the transistor Tr1 enter an on-state. Upon the transistor Tr1 being turned on, a voltage source V2 is generated, power is supplied from the voltage source V2 to a CPU 14 in a controller 12 and a FAX unit 11.

The FAX unit 11 refers to a transmitter/receiver part that transmits/receives image data when the FAX unit 11 is connected to a telephone line. Also, the FAX unit 11 can be attached/detached to/from the image forming apparatus A, and FIG. 9 indicates a state in which the FAX unit 11 is attached to the image forming apparatus A.

Upon the CPU 14 being activated as a result of power being supplied from the voltage source V2 to the controller 12, the CPU 14 outputs a high level signal to a signal line S1, thereby making the transistor Tr2 enter an on-state. During the image forming apparatus A operating, the CPU 14 continues outputting the high level signal to the signal line S1. As a result, the transistor Tr1 is maintained in the on-state, thereby the operating state of the image forming apparatus A being maintained. With the circuit operation described above, upon a user depressing the switch SW1, power is supplied from the voltage source V2 to the image forming apparatus A and the FAX unit 11, thereby the image forming apparatus A staring operating.

Next, a circuit operation for shutting down the image forming apparatus A via a power-off operation will be described.

Upon a user depressing the switch SW1 to power off the image forming apparatus A and the FAX unit 11, the voltage source V1 is applied to the switch SW1, and also to the capacitor C3 via the resistor R7. As a result, a potential at a point a in FIG. 9 rises from a ground level to a potential of the voltage source V1, and this rising edge signal is input to the CPU 14 via a signal line S2. By means of the rising edge signal, the CPU 14 detects that the user depressed the switch SW1. Then, the CPU 14 starts a shutdown sequence for powering off the image forming apparatus A (for example, data storage, mechanical spacing operation, etc.).

Upon end of the shutdown sequence, the CPU 14 outputs a low level signal to the signal line S1, thereby turning the transistor Tr2 off. Upon the transistor Tr2 being turned off, the potential of the gate of the transistor Tr1 becomes the same as the potential of the voltage source V1, and thus, the transistor Tr1 is also turned off, thereby stopping the power supply to the controller 12 and the FAX unit 11, resulting in shutting down the image forming apparatus A.

For such soft-switch power supply control as described above, for example, Japanese Patent Application Laid-Open No. 2005-285041 proposes a power supply device configured so that on/off control of power supply is performed according to an external power supply control signal, the power supply device including a reset signal generation unit that reliably resets a microcomputer.

However, in the aforementioned soft-switch power supply device described in Japanese Patent Application Laid-Open No. 2005-285041, where power from a commercial power supply is shut down because of, e.g., a power failure, the electronic apparatus is shut down, too. Then, even when power is supplied again to the electronic apparatus from the commercial power supply after recovery from the power failure, the electronic apparatus remains in a nonoperating state unless the electronic apparatus receives an external signal to activate the power supply, and thus, the electronic apparatus cannot automatically transition to an operating state. Furthermore, where the electronic apparatus has a facsimile function, a problem arises in that the electronic apparatus is unable to receive fax after the power failure unless the electronic apparatus receives an external signal to activate the power supply or a user turns the power supply switch on again.

SUMMARY OF THE INVENTION

The present invention has been made in view of the aforementioned problems, and enables provision of a soft-switch electronic apparatus that after recovery of a power failure, automatically returns to a state before occurrence of the power failure.

An object of the present invention is to provide an electronic apparatus including a direct-current voltage generation part that generates a direct-current voltage from a commercial power supply, a switching part that switches between an on-state in which the direct-current voltage from the direct-current voltage generation part is output, and an off-state in which the output of the direct-current voltage is shut down, a control part that instructs the switching part to be in the on-state or the off-state, thereby controlling operation of the direct-current voltage generation part, and a power supply maintaining part connected to the direct-current voltage generation part, the power supply maintaining part instructing the switching part to be in the on-state when power is supplied from the commercial power supply, and after instructing the switching part to be in the off-state in response to an instruction from the control part, instructing the switching part to be in the off-state until the power from the commercial power supply is shut down.

Another object of the present invention is to provide an electronic apparatus including a direct-current voltage generation part that generates a direct-current voltage from a commercial power supply, a switching part that switches between an on-state in which the direct-current voltage from the direct-current voltage generation part is output, and an off-state in which the output of the direct-current voltage is shut down, a control part that instructs the switching part to be in the on-state or the off-state, thereby controlling operation of the direct-current voltage generation part, and a power supply maintaining part connected to the direct-current voltage generation part, the power supply maintaining part instructing the switching part to be in the on-state for a preset period of time when power is supplied from the commercial power supply, and after the elapse of the preset period of time, instructing the switching part to be in the off-state until the power from the commercial power supply is shut down.

A further object of the present invention is to provide a power supply device that supplies power to an electronic apparatus, the electronic apparatus including a direct-current voltage generation part that generates a direct-current voltage from a commercial power supply a switching part that switches between an on-state in which the direct-current voltage from the direct-current voltage generation part is output, and an off-state in which the output of the direct-current voltage is shut down; a control part that instructs the switching part to be in the on-state or the off-state, thereby controlling operation of the direct-current voltage generation part; and a power supply maintaining part connected to the direct-current voltage generation part, the power supply maintaining part instructing the switching part to be in the on-state when power is supplied from the commercial power supply, and after instructing the switching part to be in the off-state in response to an instruction from the control part, instructing the switching part to be in the off-state until the power from the commercial power supply is shut down.

A still further object of the present invention is to provide a power supply device that supplies power to an electronic apparatus, the electronic apparatus including a direct-current voltage generation part that generates a direct-current voltage from a commercial power supply, a switching part that switches between an on-state in which the direct-current voltage from the direct-current voltage generation part is output, and an off-state in which the output of the direct-current voltage is shut down; a control part that instructs the switching part to be in the on-state or the off-state, thereby controlling operation of the direct-current voltage generation part, and a power supply maintaining part connected to the direct-current voltage generation part, the power supply maintaining part instructing the switching part to be in the on-state for a preset period of time when power is supplied from the commercial power supply, and after the elapse of the preset period of time, instructing the switching part to be in the off-state until the power from the commercial power supply is shut down.

Further objects of the present invention will be apparent from the following detailed description and the attached drawings.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

A configuration and operation of the present invention will be described below. Embodiments described below are mere examples and not intended to limit the technical scope of the present invention to these embodiments.

Embodiment 1

The present embodiment will be described below with reference to FIGS. 1 to 4. A description of operation of a circuit that is similar to that of the circuit configuration according to the conventional example, which has been described in the Description of the Related Art section, will be omitted.

Figure 1:
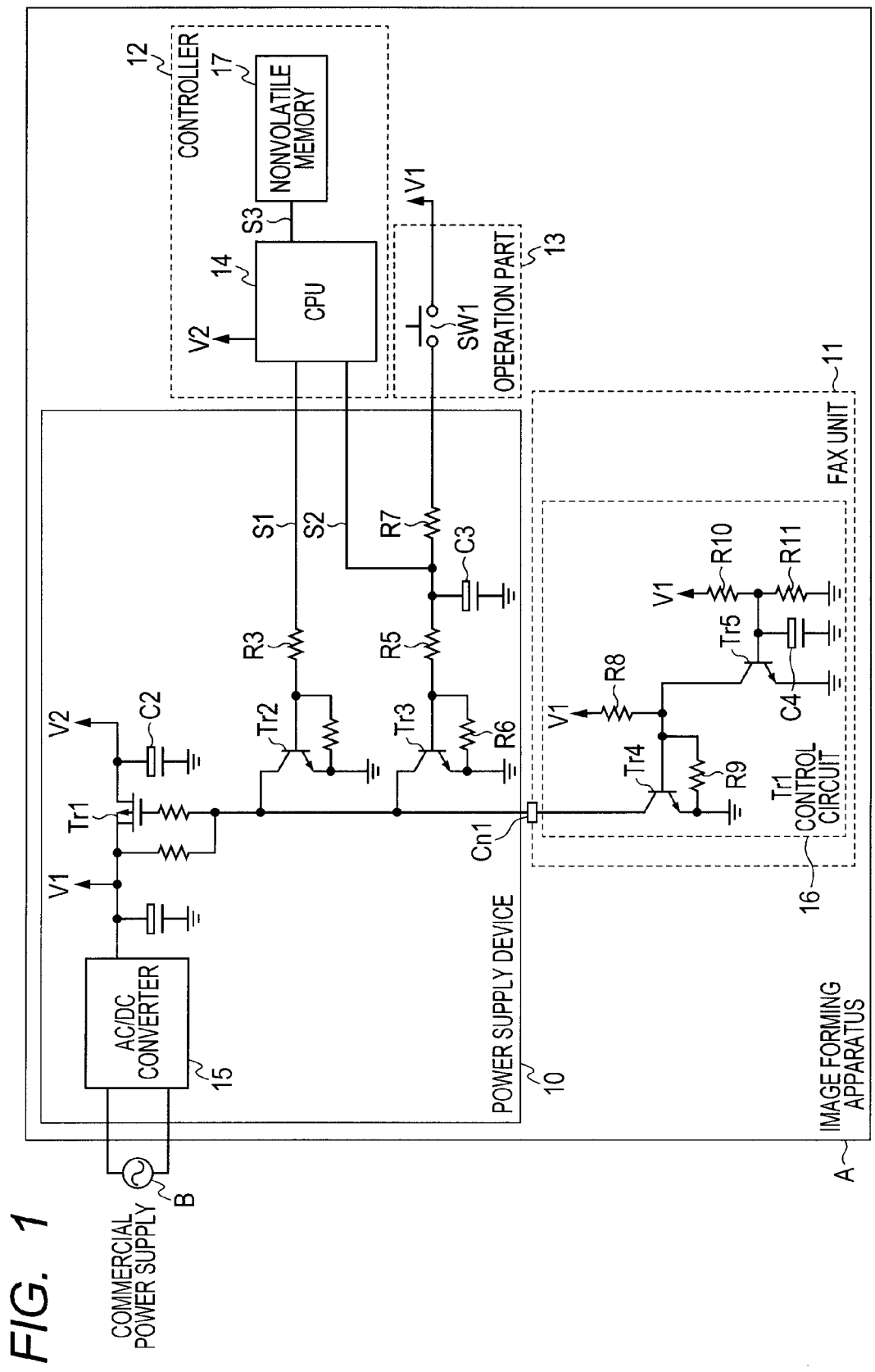
FIG. 1 is a block diagram of an image forming apparatus according to Embodiment 1.

FIG. 1 is a block diagram illustrating a configuration of an image forming apparatus according to the present embodiment with a soft-switch power supply device incorporated therein. Upon power being supplied from a commercial power supply B to a power supply device 10 in an image forming apparatus A via a plug such as an inlet plug, an AC/DC converter 15 generates a direct-current voltage source V1 having a predetermined voltage (hereinafter referred to as "voltage source 1"). A transistor Tr1 (power supply switch unit) switches between supply and non-supply of power from the voltage source V1 to electrical units (fans, motors, sensors, etc.) in the image forming apparatus: the power is supplied when the transistor Tr1 is in an on-state while the power is not supplied when the transistor Tr1 is in an off-state. When the transistor Tr1 is in an on-state, the power is charged into a capacitor C2 via the transistor Tr1, thereby generating a direct-current voltage source V2 (hereinafter referred to as "voltage source V2"), which is a power supply part that supplies power to the electrical units in the image forming apparatus. Supply of power from the voltage source V2 to a controller 12 and the other electrical units in the image forming apparatus A enables the image forming apparatus A to operate.

In an operation part 13, a momentary switch SW1 (switch unit) is provided. A user depresses the switch SW1 when turning on/off the power supply to the image forming apparatus A.

A FAX unit 11 is configured so as to be attached/detached to/from the image forming apparatus A via a connector Cn1. The FAX unit 11 is a transmitter/receiver part that transmits/receives data when the FAX unit 11 is connected to a telephone line. When the FAX unit 11 is not connected to the image forming apparatus A, the connector Cn1 is left unconnected.

A Tr1 control circuit 16 (power supply maintaining unit) provided in the FAX unit 11 includes resistors R8 to R11, transistors Tr4 and Tr5 and a capacitor C4, which are connected as illustrated in FIG. 1.

The transistor Tr1 is a P-channel FET (field-effect transistor) and the transistors Tr2 to Tr5 are NPN bipolar transistors.

Figure 2:
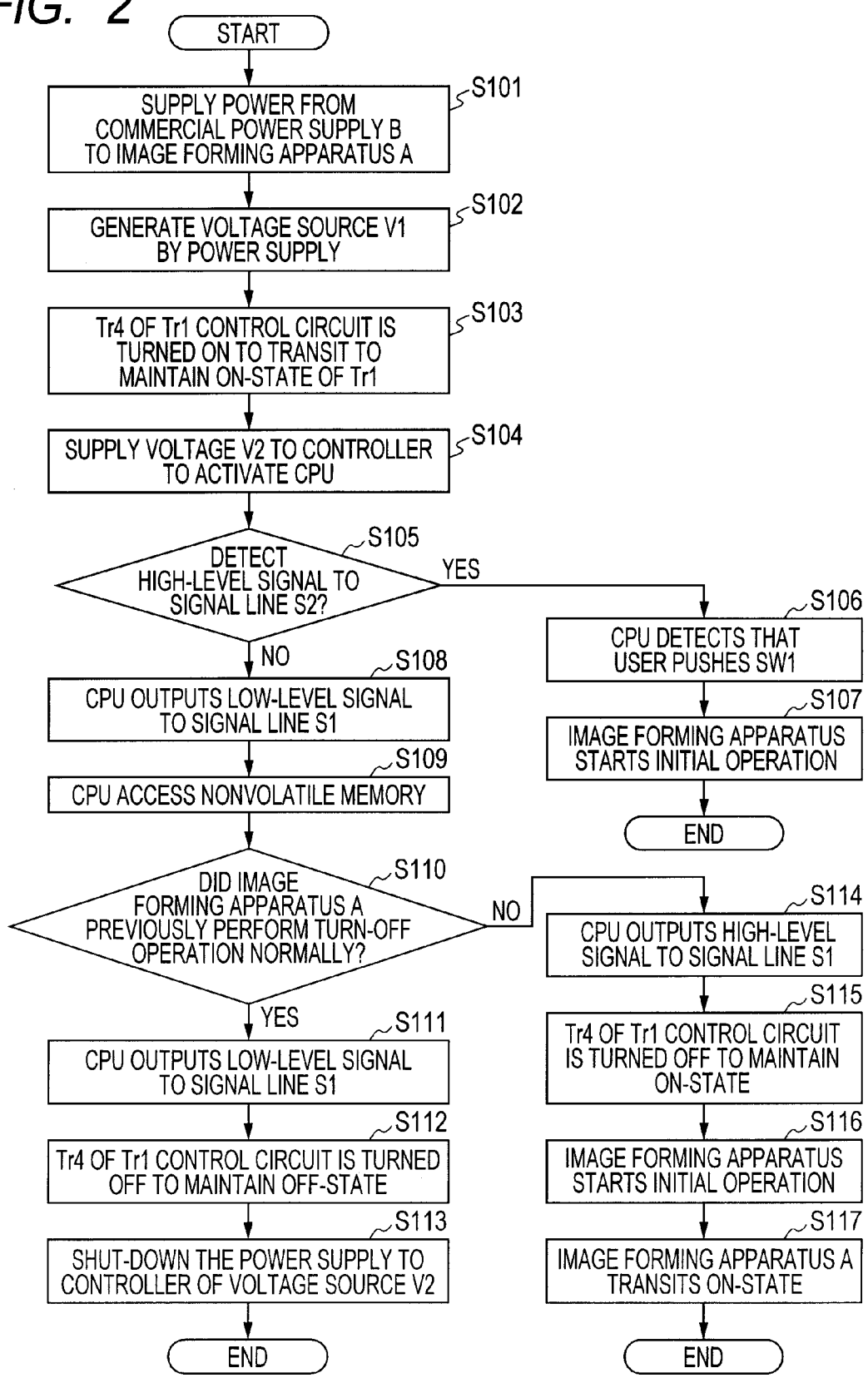
FIG. 2 is a flowchart illustrating a procedure for activating an image forming apparatus according to Embodiment 1 after a power failure.

Next, an operation of the present embodiment will be described according to the flowchart in FIG. 2.

When the image forming apparatus A is plugged in or the commercial power supply B recovers from a power failure, the power supply device 10 in the image forming apparatus A is supplied with power from the commercial power supply B (S101). Then, the AC/DC converter 15 in the power supply device 10 is activated and generates the voltage source V1 (S102).

Upon generation of the voltage source V1, the Tr1 control circuit 16 in the FAX unit 11 is supplied with power from the voltage source V1, thereby the Tr1 control circuit 16 being activated. A base current is supplied from the voltage source V1 to the transistor Tr4 via the resistor R8, thereby the transistor Tr4 entering an on-state, and as a result, a potential of a gate of the transistor Tr1 transitions to a ground level, thereby the transistor Tr1 entering an on-state (S103).

Although charge of power into the capacitor C4 from the voltage source V1 via the resistor R10 is started, a potential of a base of the transistor Tr5 rises at a predetermined time constant by means of a time constant circuit including the resistors R10, and R11 and the capacitor C4. Accordingly, the transistor Tr5 does not immediately enter an on-state.

For example, under the states, the voltage source V1=3.3 V, the resistor R10=33 kΩ the resistor R11=10 kΩ, the capacitor C4=47 μF, a base current starts to flow in the transistor Tr5 about 500 msec from the generation of the voltage source V1, thereby the transistor Tr5 entering an on-state.

Upon the transistor Tr1 entering an on-state, the voltage source V1 is supplied to the capacitor C2 via the transistor Tr1, thereby the capacitor C2 being charged with power, generating the voltage source V2. Upon power being supplied from the voltage source V2 to the CPU 14 (control unit) in the controller 12, the CPU 14 is activated (S104). After the activation, the CPU 14 checks a level of a signal from the signal line S2 to determine whether the present activation is attributable to depression of the switch SW1 by a user or recovery from a power failure (S105).

When a user depresses the switch SW1, the voltage source V1 is supplied to the capacitor C3 via the resistor R7, thereby the level of the signal on the signal line S2 transitioning to a high level. If the CPU 14 has recognized that the level of the signal from the signal line S2 is a high level (S105), the CPU 14 determines that the activation of the image forming apparatus A is attributable to an instruction via a user's operation (S106), and starts an initial operation of the image forming apparatus A (S107).

If the CPU 14 has recognized that the level of the signal from the signal line S2 is not a high level, the CPU 14 determines that the present activation is attributable to recovery from a power failure. Then, the CPU 14 outputs a low level signal to the signal line S1 (S108), and then accesses a predetermined address in a nonvolatile memory 17 via a signal line S3 (S109). Here, a predetermined address refers to a memory address in the nonvolatile memory 17, in which an operating state of the image forming apparatus A has been written. Where the image forming apparatus A is in an operating state, the CPU writes information relating to the operating state (sleeping state, standby state or image-forming operation state) and information to the effect that the image forming apparatus A is in a turn-on-state of a power as a result of the transistor Tr1 entering an on-state to the predetermined address in the nonvolatile memory 17. Meanwhile, when a user turns off the power supply to the image forming apparatus A, the CPU 14 erases the information relating to the operating state, which has been written in the predetermined address in the nonvolatile memory 17, and writes information to the effect that the image forming apparatus A is in a turn-off-state as a result of the transistor Tr1 entering an off-state.

Accordingly, if the CPU 14 cannot recognize data indicating the operating state at the accessed predetermined address in the nonvolatile memory 17, the CPU 14 determines that the image forming apparatus A was in a turn-off-state as a result of the image forming apparatus A normally performing a power-off operation when there was a power failure in the commercial power supply B (S110). In this case, the CPU 14 keeps the low level signal output to the signal line S1 (S111).

Subsequently, in the Tr1 control circuit 16, a base current flows in the transistor Tr5 after the elapse of about 500 msec by means of the time constant circuit including the resistors R10 and R11 and the capacitor C4, thereby the transistor Tr5 entering an on-state. Upon the transistor Tr5 entering an on-state, a potential of a base of the transistor Tr4 transitions to a ground level at which the base current does not flow, thereby the transistor Tr4 entering an off-state. The transistor Tr5 is maintained in the on-state by power supply from the voltage source V1 unless the power from the commercial power supply B is shut down by, e.g., a power failure. Consequently, the potential of the base of the transistor Tr4 transitions to a ground level and the transistor Tr4 is maintained in an off-state.

Upon the transistor Tr4 entering an off-state, the potential of the gate of the transistor Tr1 becomes the same as the potential of the voltage source V1, resulting in the transistor Tr1 transitioning to an off-state (S112). Upon the transistor Tr1 entering an off-state, the voltage source V2 is no longer generated, resulting in the power supply from the voltage source V2 to the CPU 14 in the controller 12 being shut down, and accordingly, the operation of the controller 12 is stopped (S113), thereby the operation of the image forming apparatus A being stopped.

Meanwhile, if the CPU 14 has recognized data indicating that the forming apparatus A was in an operating state as a result of accessing the predetermined address in the nonvolatile memory 17, the CPU 14 determines that the power from the commercial power supply B is shut down by a power failure during operation of the image forming apparatus A (S110).

Then, the CPU 14 outputs a high level signal to the signal line S1 in order to bring the image forming apparatus A back to the state before the power failure, that is, the state in which the image forming apparatus is operating, and keeps such state (S114). When the level of the signal on the signal line S1 is maintained to be a high level, a base current flows in the transistor Tr2, thereby the transistor Tr2 being maintained in an on-state.

Subsequently, in the Tr1 control circuit 16, a base current flows in the transistor Tr5 after the elapse of about 500 msec by means of the existence of the time constant circuit including the resistors R10 and R11 and the capacitor C4, thereby the transistor Tr5 entering an on-state. Upon the transistor Tr5 entering an on-state, the potential of the base of the transistor Tr4 transitions to a ground level at which no base current flows, thereby the transistor Tr4 entering an off-state.

As long as the supply of power from the commercial power supply B is maintained, the transistor Tr5 is maintained in the on-state by the voltage source V1, and as a result, the potential of the base of the transistor Tr4 is kept at a ground level, thereby the transistor Tr4 being maintained in the off-state. Here, although the transistor Tr4 comes into the off-state, the transistor Tr1 is maintained in an on-state because the signal line S1 is at a high level, and accordingly, the potential of the gate of the transistor Tr1 is maintained at a ground level and the transistor Tr1 is maintained in an on-state (S115).

Subsequently, the image forming apparatus A starts an initial operation (S116) to transition to an operating state (S117), thereby returning to the state before the power failure.

Figure 3:
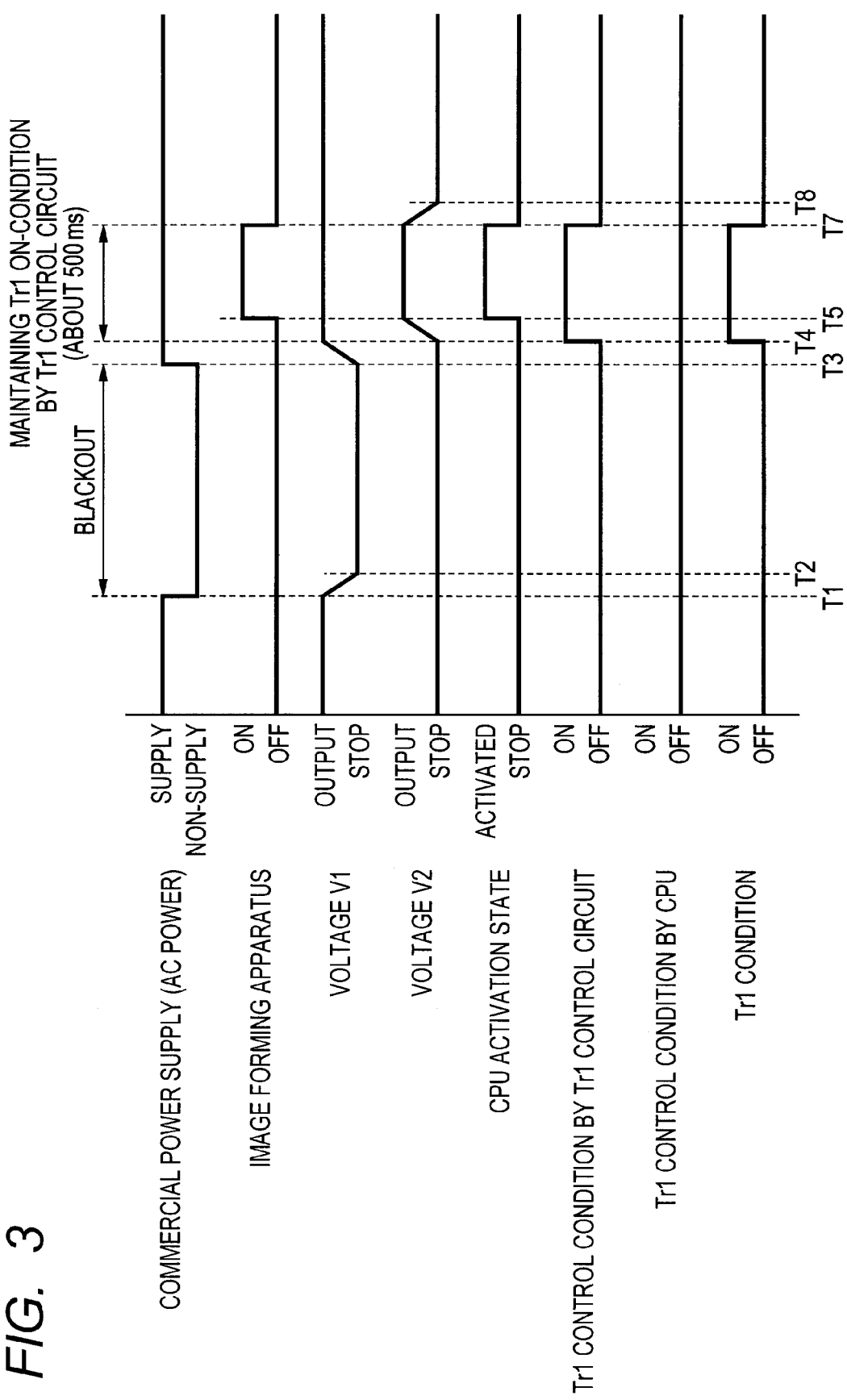
FIG. 3 is a timing chart illustrating an operating state of an image forming apparatus according to Embodiment 1 before and after a power failure where the image forming apparatus was in a turn-off-state of a power before the power failure.

Next, an operation of the image forming apparatus at the time of recovery from a power failure will be described with reference to the timing chart in FIG. 3. In FIG. 3, the image forming apparatus A is in a turn-off-state, and a power failure occurs at a time T1.

When the power from the commercial power supply B is shut down at the time T1, the voltage source V1 cannot be generated any longer in the power supply device 10. Accordingly, from the time T1 to a time T2, the potential of the voltage source V1 gradually falls, and at the time T2, the voltage source V1 substantially reaches a ground level.

Subsequently, upon recovery from the power failure at a time T3, the power supply device 10 is activated again. From the time T3 to a time T4, the potential of the voltage source V1 gradually rises, and at the time T4, the potential of the voltage source V1 becomes stable, thereby the voltage source V1 entering an active state.

Upon the voltage source V1 being activated at the time T4, the Tr1 control circuit 16 is activated and performs control to make the transistor Tr1 enter an on-state. As a result of the transistor Tr1 entering an on-state, the potential of the voltage source V2 gradually rises from the time T4 to a time T5. Upon the voltage source V2 being activated at the time T5, the CPU 14 is activated, thereby the image forming apparatus A entering an operating state.

During a period of about 500 ms from the time T4 to a time T7, the transistor Tr1 is maintained in the on-state by the Tr1 control circuit 16. During the time T5 to the time T7, the CPU 14 accesses the nonvolatile memory 17 and detects that the image forming apparatus A was in an off-state before the power failure. Therefore, the CPU 14 does not maintain the turn-on-state of the image forming apparatus A, but leaves a level of a signal on the signal line S1 at a low level as it is at the time of recovery from the power failure, in order to bring the image forming apparatus A back to the state before the power failure, that is, a turn-off-state. At the time T7, the on-state of the transistor Tr1 provided by the Tr1 control circuit 16 is cancelled and in addition, the signal line S1 is at a low level, and thus, the transistor Tr2 remains in an off-state. Accordingly, the transistor Tr1 transitions to an off-state, and the potential of the voltage source V2 starts falling. As a result of the potential of the voltage source V2 falling, the CPU 14 stops operating and the image forming apparatus A also stops operating, and thus, at a time T8, the potential of the voltage source V2 substantially reaches a ground level.

Figure 4:
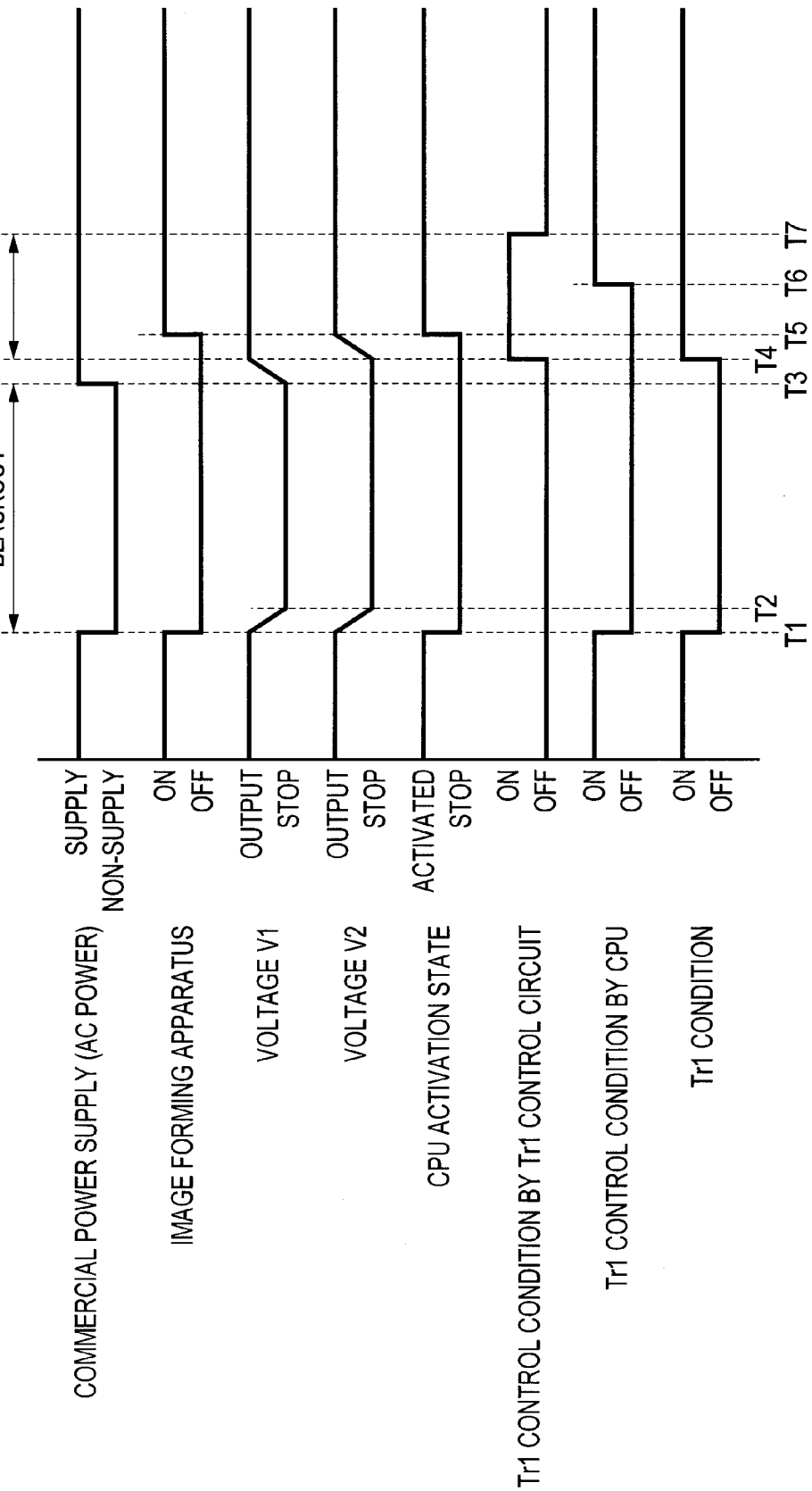
FIG. 4 is a timing chart illustrating an operating state of an image forming apparatus according to Embodiment 1 before and after a power failure where the image forming apparatus was in a turn-on-state of a power before the power failure.

Next, an operation of the image forming apparatus at the time of recovery from a power failure will be described with reference to the timing chart in FIG. 4. In FIG. 4, the image forming apparatus A is in a turn-on-state and a power failure occurs at a time T1. Before the power failure, the voltage sources V1 and V2 are in an output state, and the transistor Tr1 is maintained in an on-state by the CPU 14. The state of the Tr1 control circuit 16's control of the transistor Tr1 is in an off-state.

When the power from the commercial power supply B is shut down at the time T1, the voltage source V1 cannot be generated any longer in the power supply device 10. Accordingly, from the time T1 to a time T2, the potential of the voltage source V1 gradually falls and substantially reaches a ground level at the time T2. Simultaneously with the fall of the potential of the voltage source V1, the potential of the voltage source V2 also falls and substantially reaches a ground level at the time T2. With the fall of the potential of the voltage source V2, the CPU also stops operating, and thus, the on-state of the transistor Tr1 provided by the CPU 14 is cancelled, and thus, the transistor Tr1 transitions to an off-state.

Subsequently, upon recovery from the power failure at a time T3, the power supply device 10 is activated again. From the time T3 to a time T4, the potential of the voltage source V1 gradually rises, and at the time T4, the potential of the voltage source V1 becomes stable, thereby the voltage source V1 entering an active state.

Upon the voltage source V1 being activated at the time T4, the Tr1 control circuit 16 is activated and performs control to make the transistor Tr1 enter an on-state, thereby the transistor Tr1 entering an on-state, and as a result, the potential of the voltage source V2 gradually rises from the time T4 to a time T5. Upon the voltage source V2 being activated at the time T5, the CPU is activated, thereby the image forming apparatus A entering an operating state. The on-state of the transistor Tr1 provided by the Tr1 control circuit 16 is maintained for a predetermined period of time from the time T4 to a time T7 (about 500 msec).

During the time T5 to a time T6, the CPU 14 accesses the nonvolatile memory 17 and detects that the image forming apparatus A was in an on-state before the power failure. The CPU 14 outputs a high level signal to the signal line S1 at the time T6 to make the transistor Tr1 enter an on-state, in order to bring the image forming apparatus A back to the state before the power failure, that is, a turn-on-state.

Subsequently, at a time T7, the on-state of the transistor Tr1 provided by the Tr1 control circuit 16 is cancelled, but since the transistor Tr1 is maintained in an on-state by the CPU 14, the image forming apparatus A is maintained in an on-state. Subsequently, the image forming apparatus A starts an initial operation and transitions to an operating state, thereby returning to the state before the power failure.

As described above, the present embodiment enables provision of a soft-switch image forming apparatus that when power from a commercial power supply is shut down by, e.g., a power failure and then is resumed, returns to a state before the power failure. In other words, where a power failure occurs when the image forming apparatus is in an turn-off-state, the image forming apparatus can be restored to a turn-off-state after recovery from the power failure, and where a power failure occurs when the image forming apparatus is in a turn-on-state, the image forming apparatus can be restored to a turn-on-state after recovery from the power failure. Accordingly, the image forming apparatus is not unnecessarily left in a turn-on-state after recovery from a power failure, enabling improvement of energy conservation. Furthermore, the power supply is automatically turned on after recovery from a power failure, enabling solution of the problem of the image forming apparatus not operating in spite of recovering from a power failure.

Furthermore, the image forming apparatus is controlled to be in an on-state or an off-state after recovery from a power failure, based on information relating to an operating state left in a nonvolatile memory, which is a nonvolatile memory unit, enabling the image forming apparatus to be reliably restored to a state before a power failure even though the power failure is one that lasts for a long time.

Furthermore, the state of a circuit that automatically turns on the power supply to the image forming apparatus after recovery from a power failure (automatic turn-on circuit) is automatically switched from an operating state to a nonoperating state by a time-constant circuit, eliminating the need for control by the CPU.

Although in the present embodiment, the Tr1 control circuit 16 is provided in the FAX unit 11, the Tr1 control circuit 16 may be provided in the power supply device 10 or any other unit in the image forming apparatus A.

Embodiment 2

The present embodiment will be described with reference to FIGS. 5 to 8.

Figure 5:
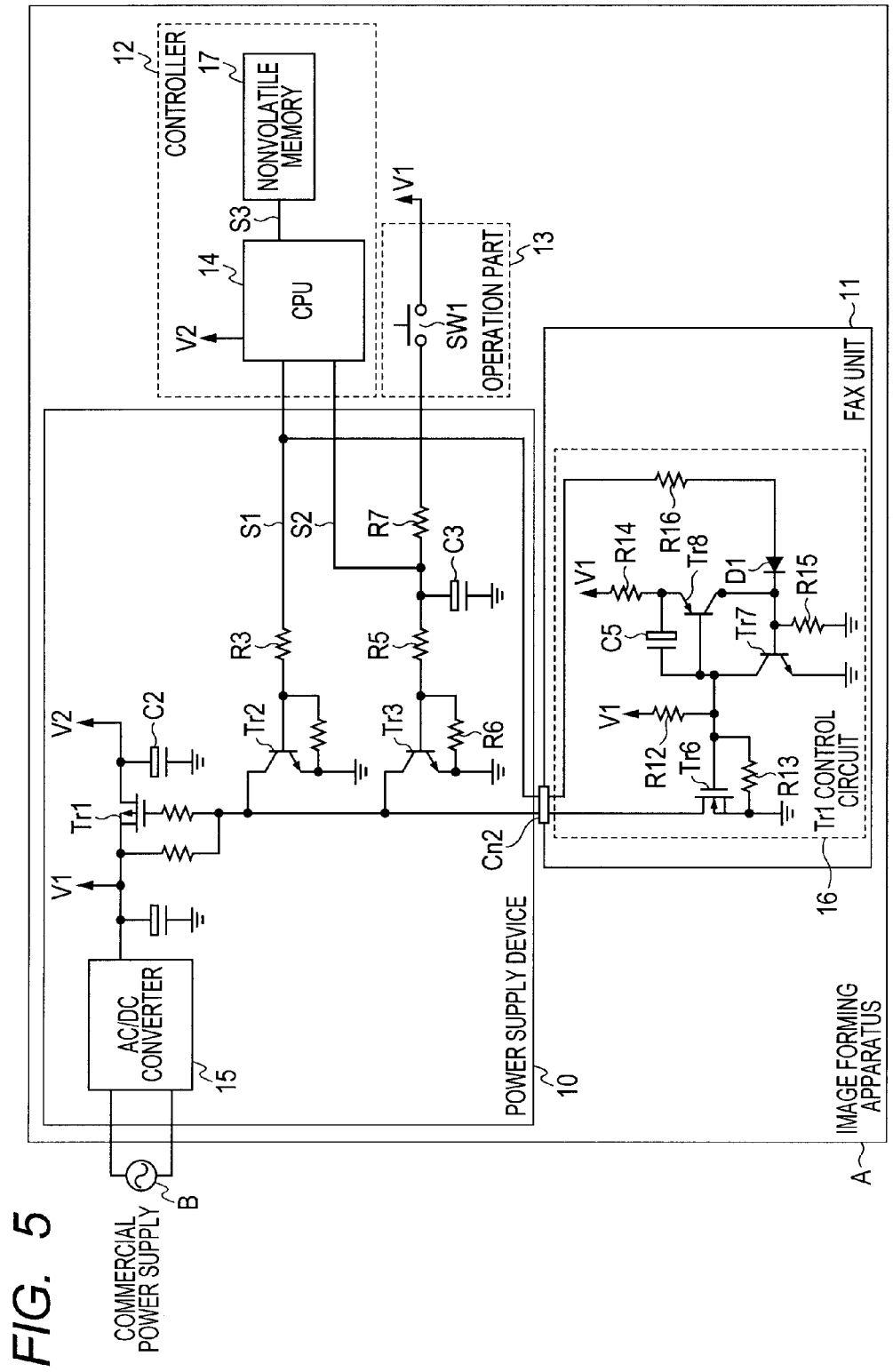
FIG. 5 is a block diagram of an image forming apparatus according to Embodiment 2.

FIG. 5 is a block diagram illustrating an image forming apparatus the present embodiment, the image forming apparatus including a soft-switch power supply device incorporated therein. In Embodiment 1, the Tr1 control circuit 16 that automatically turns on the power supply to the image forming apparatus employs a method in which the state is automatically switched from an operating state to a nonoperating state by means of a time-constant circuit. The present embodiment employs a method in which switching of a Tr1 control circuit from an operating state to a nonoperating state is controlled by a CPU 14, which is different from the method in Embodiment 1. In FIG. 5, the circuit configuration except a Tr1 control circuit 16 is similar to that of the Embodiment 1, and thus, a description of operation of the circuit will be omitted.

A FAX unit 11 is configured so as to be attached/detached to/from the image forming apparatus A via a connector Cn2. The FAX unit 11 is a transmitter/receiver part that transmits/receives data when the FAX unit 11 is connected to a telephone line. When the FAX unit 11 is not connected to the image forming apparatus A, the connector Cn1 is left unconnected.

A Tr1 control circuit 16, which is provided in the FAX unit 11, includes resistors R12 to R16, transistors Tr6 to Tr8, a capacitor C5 and a diode D1, which are connected as illustrated in FIG. 5.

A transistor Tr1 is a P-channel FET (field-effect transistor), the transistor Tr6 is an N-channel FET, transistors Tr2, Tr1 and Tr7 are NPN bipolar transistors, and the transistor Tr8 is a PNP bipolar transistor.

Figure 6:
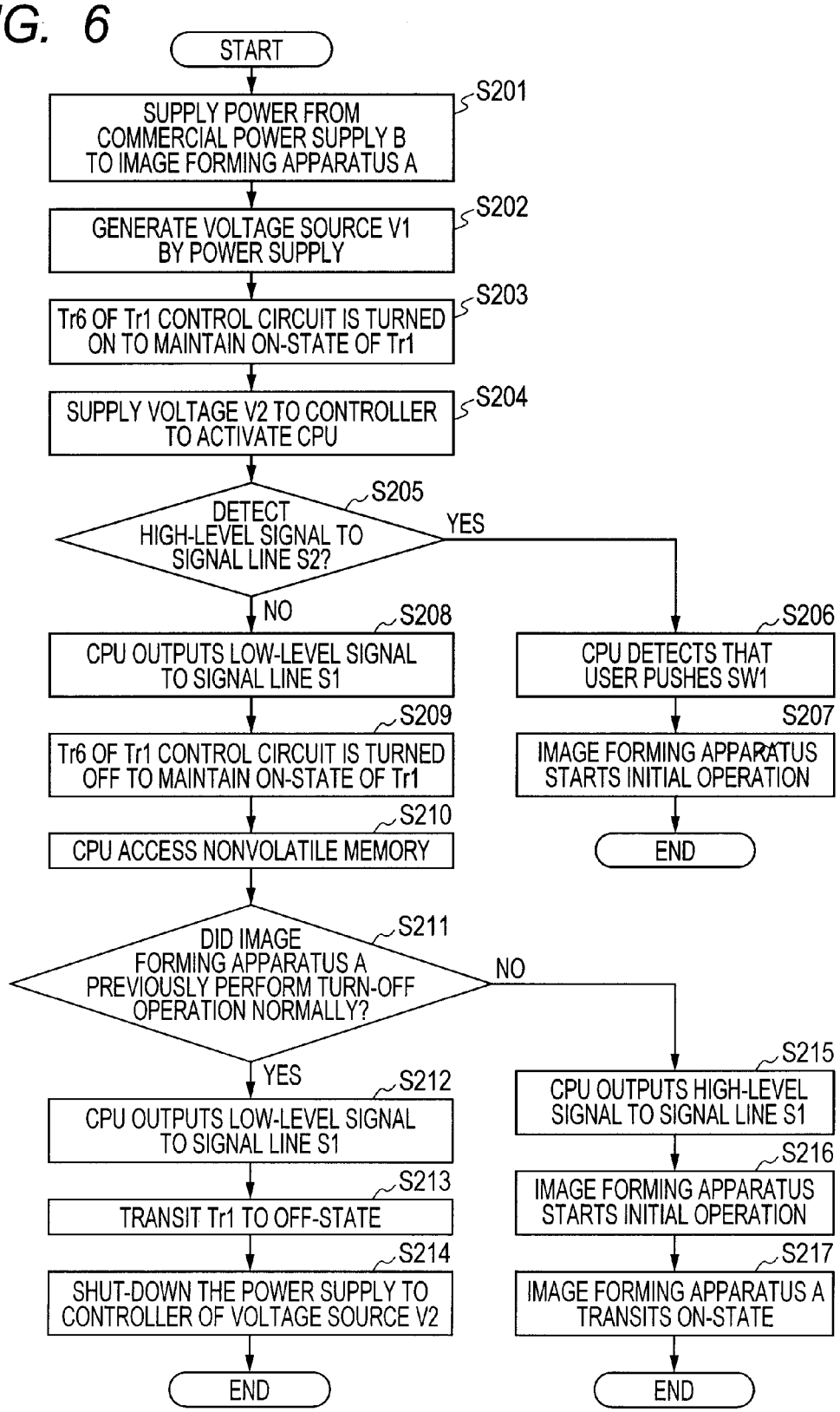
FIG. 6 is a flowchart illustrating a procedure for activating an image forming apparatus according to Embodiment 2 after a power failure.

Next, an operation of the present embodiment will be described according to the flowchart in FIG. 6.

When the image forming apparatus A is plugged in or the commercial power supply B recovers from a power failure, the power supply device 10 in the image forming apparatus A is supplied with power from the commercial power supply B (S201). Then, the AC/DC converter 15 in the power supply device 10 is activated and generates the voltage source V1 (S202).

Upon generation of the voltage source V1, the Tr1 control circuit 16 in the FAX unit 11 is supplied with power from the voltage source V1, thereby the Tr1 control circuit 16 being activated. The voltage source V1 is applied to a gate of the transistor Tr6, thereby the transistor Tr6 entering an on-state, and as a result, as a result, a potential of a gate of the transistor Tr1 transitions to a ground level, thereby the transistor Tr1 entering an on-state (S203).

Upon the transistor Tr8 entering an on-state as a result of the voltage source V1 being applied to a base of the transistor Tr8, the transistor Tr7 comes into an on-state, and as a result, a potential of the gate of the transistor Tr6 transitions to a ground level, which makes the transistor Tr6 enter an off-state. In order to prevent this situation, a capacitor C5 is provided between a base and an emitter of the transistor Tr8 to provide a circuit configuration in which the transistor Tr1 does not immediately enter an on-state when the Tr1 control circuit 16 is activated.

Upon the transistor Tr1 entering an on-state, the voltage source V1 is supplied to the capacitor C2 via the transistor Tr1, thereby the capacitor C2 being charged with power, generating the voltage source V2. Upon power being supplied from the voltage source V2 to the CPU 14 in the controller 12, the CPU 14 is activated (S204). After the activation, the CPU 14 checks a level of a signal from the signal line S2 to determine whether the present activation is attributable to depression of the switch SW1 by a user or recovery from a power failure (S205).

When a user depresses the switch SW1, the voltage source V1 is supplied to a capacitor C3 via the resistor R7, thereby the level of the signal on the signal line S2 transitioning to a high level. If the CPU 14 has recognized that the level of the signal from the signal line S2 is a high level (S205), the CPU 14 determines that the activation of the image forming apparatus A is attributable to an instruction via a user's operation (S206), and starts an initial operation of the image forming apparatus A (S207).

If the CPU 14 has recognized that the level of the signal from the signal line S2 is not a high level, the CPU 14 determines that the present activation is attributable to recovery from a power failure. Then, the CPU 14 outputs a low level signal to the signal line S1 (S208). Upon the level of the signal on the signal line S1 transitioning to a high level, a base current is supplied to the transistor Tr2 via a resistor R3, thereby the transistor Tr2 entering an on-state.

The high level signal from the signal line S1 is output also to the Tr1 control circuit 16 via the connector Cn2. The high level signal from the signal line S1 makes a base current flow in the transistor Tr7 via a resistor R16 and a diode D1, thereby the transistor Tr7 entering an on-state. Upon the transistor Tr7 entering an on-state, a potential of a collector of the transistor Tr7 transitions to a ground level, thereby the transistor Tr6 entering an off-state. Simultaneously, a potential of a base of the transistor Tr8 also transitions to a ground level, thereby the transistor Tr8 entering an on-state, and thus, the base current is continuously supplied to the transistor Tr7 from the voltage source V1 via the resistor R14 and transistor Tr8.

Consequently, the transistor Tr6 is maintained in the off-state, the transistor Tr7 is maintained in the on-state, and the transistor Tr8 is maintained in the on-state unless the power from the commercial power supply B is shut down by, e.g., a power failure. Here, since the transistor Tr2 is maintained in the on-state by the CPU 14, the on-state of the transistor Tr1 is also maintained (S209).

Subsequently, the CPU 14 starts accessing a predetermined address in a nonvolatile memory 17 via a signal line S3 (S210). Here, a predetermined address refers to a memory address in the nonvolatile memory 17, in which an operating state of the image forming apparatus A has been written. Where the image forming apparatus A is in an operating state, the CPU 14 writes information relating to the operating state (sleeping state, standby state or image-forming operation state) and information to the effect that the image forming apparatus A is in a turn-on-state as a result of the transistor Tr1 entering an on-state to the predetermined address in the nonvolatile memory 17. Meanwhile, when a user turns off the power supply to the image forming apparatus A, the CPU 14 erases the information relating to the operating state, which has been written in the predetermined address in the nonvolatile memory 17, and writes information to the effect that the image forming apparatus A is in a turn-off-state as a result of the transistor Tr1 entering an off-state.

Accordingly, if the CPU 14 cannot recognize data indicating the operating state at the accessed predetermined address in the nonvolatile memory 17, the CPU 14 determines that the image forming apparatus A was in a turn-off-state as a result of the image forming apparatus A normally performing a power-off operation when there was a power failure in the commercial power supply B (S211). In this case, the CPU 14 switches the level of the signal output to the signal line S1 from a high level to a low level (S212).

Consequently, the base current is no longer supplied to the transistor Tr2, thereby the transistor Tr2 entering an off-state, and as a result, a potential of a gate of the transistor Tr1 becomes the same as the potential of the voltage source V1, resulting in the transistor Tr1 transitioning to an off-state (S213). Upon the transistor Tr1 entering an off-state, the voltage source V2 is no longer generated, resulting in the supply of the voltage source V2 to the CPU 14 in the controller 12 being shut down, and accordingly, the operation of the controller 12 is stopped (S214), that is, the operation of the image forming apparatus A is stopped.

Meanwhile, if the CPU 14 has recognized data indicating that the forming apparatus A was in an operating state as a result of accessing the predetermined address in the nonvolatile memory 17, the CPU 14 determines that the power from the commercial power supply B is shut down by a power failure during operation of the image forming apparatus A (S211).

Then, the CPU 14 continues outputting a high level signal to the signal line S1 in order to bring the image forming apparatus A back to the state before the power failure, that is, the state in which the image forming apparatus is operating (S215). When the level of the signal on the signal line S1 is maintained to be a high level, a base current flows in the transistor Tr2, thereby the transistor Tr2 being maintained in an on-state. Subsequently, the image forming apparatus A starts an initial operation (S216) to transition to an operating state (S217), thereby returning to the state before the power failure.

Figure 7:
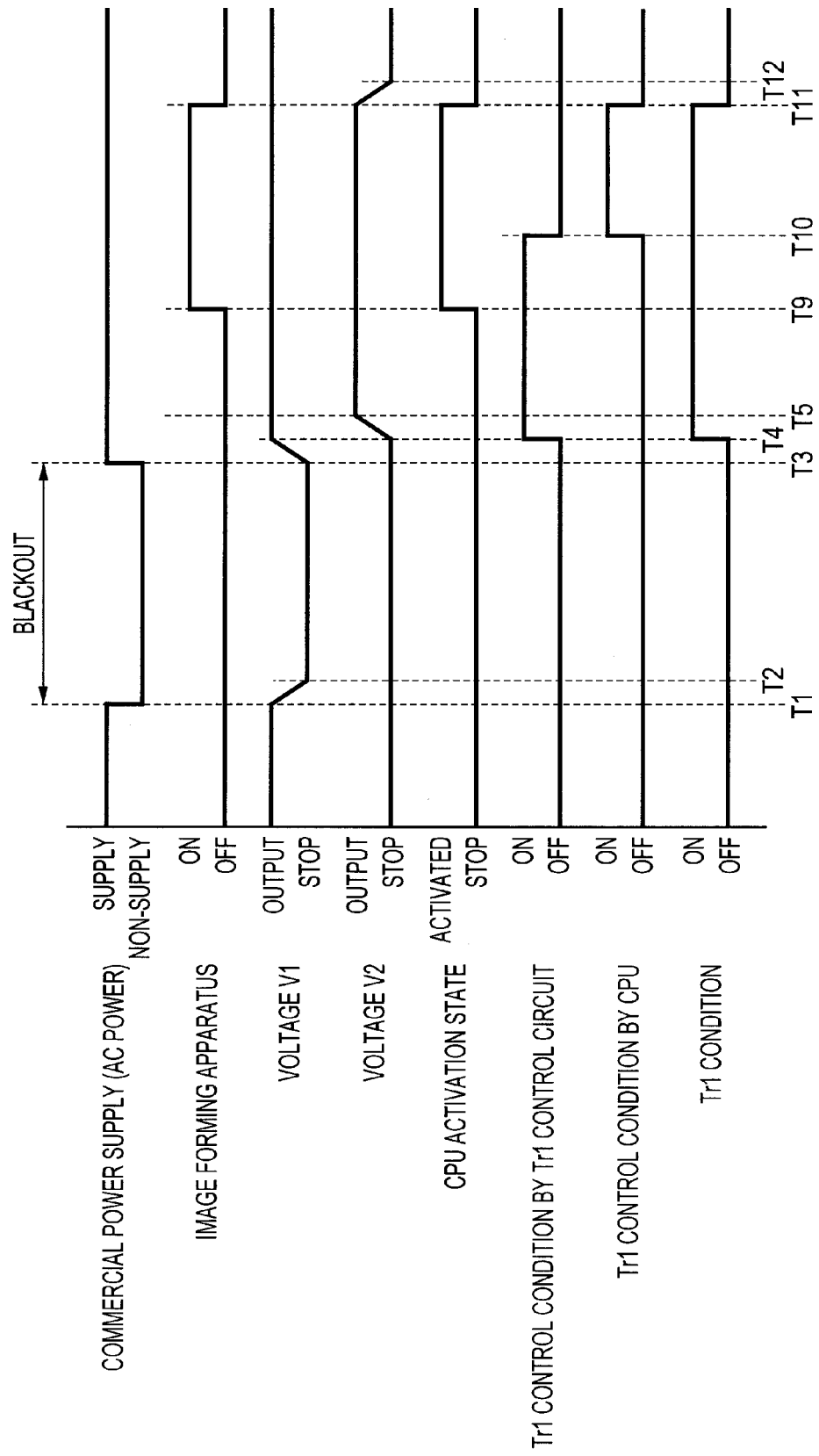
FIG. 7 is a timing chart illustrating an operating state of an image forming apparatus according to Embodiment 2 before and after a power failure where the image forming apparatus was in a turn-off-state before the power failure.

Next, an operation of the image forming apparatus at the time of recovery from a power failure will be described with reference to the timing chart in FIG. 7. In FIG. 7, the image forming apparatus A is in a turn-off-state, and a power failure occurs at a time T1.

When the power from the commercial power supply B is shut down at the time T1, the voltage source V1 cannot be generated any longer in the power supply device 10. Accordingly, from the time T1 to a time T2, the potential of the voltage source V1 gradually falls, and at the time T2, the voltage source V1 substantially reaches a ground level.

Subsequently, upon recovery from the power failure at a time T3, the power supply device 10 is activated again. From the time T3 to a time T4, the potential of the voltage source V1 gradually rises, and at the time T4, the potential of the voltage source V1 becomes stable, thereby the voltage source V1 entering an active state.

Upon the voltage source V1 being activated at the time T4, the Tr1 control circuit 16 is activated and performs control to make the transistor Tr1 enter an on-state. As a result of the transistor Tr1 entering an on-state, the potential of the voltage source V2 gradually rises from the time T4 to a time T5. Upon the voltage source V2 becoming stable at the time T5, the voltage source V2 comes into an active state, and subsequently, the CPU 14 is activated at a time T9, thereby the image forming apparatus A entering an operating state.

In order to maintain the image forming apparatus A in a turn-on-state, the CPU 14 outputs a high level signal to the signal line S1 at a time T10, thereby maintaining the transistor Tr1 in an on-state. The high level signal from the signal line S1 is simultaneously output also to the Tr1 control circuit 16, and as described above, the transistor Tr6 thereby comes into an off-state. Consequently, the transistor Tr1 is released from the control to maintain the transistor Tr1 in the on-state, and the transistor Tr7 is maintained in an on-state, thereby the released state being maintained.

Then, the CPU 14 accesses the nonvolatile memory 17 and detects that the image forming apparatus A was in an off-state before the power failure. In order to bring the image forming apparatus A back to the state before the power failure, that is, a turn-off-state, the CPU 14 outputs a low level signal to the signal line S1 at a time T11, thereby the transistor Tr1 entering an off-state, and the potential of the voltage source V2 starts falling. With the fall of the potential of the voltage source V2, the CPU 14 stops operating, and thus, the image forming apparatus A stops operating, and thus, at a time T12, the potential of the voltage source V2 substantially reaches a ground level.

Figure 8:
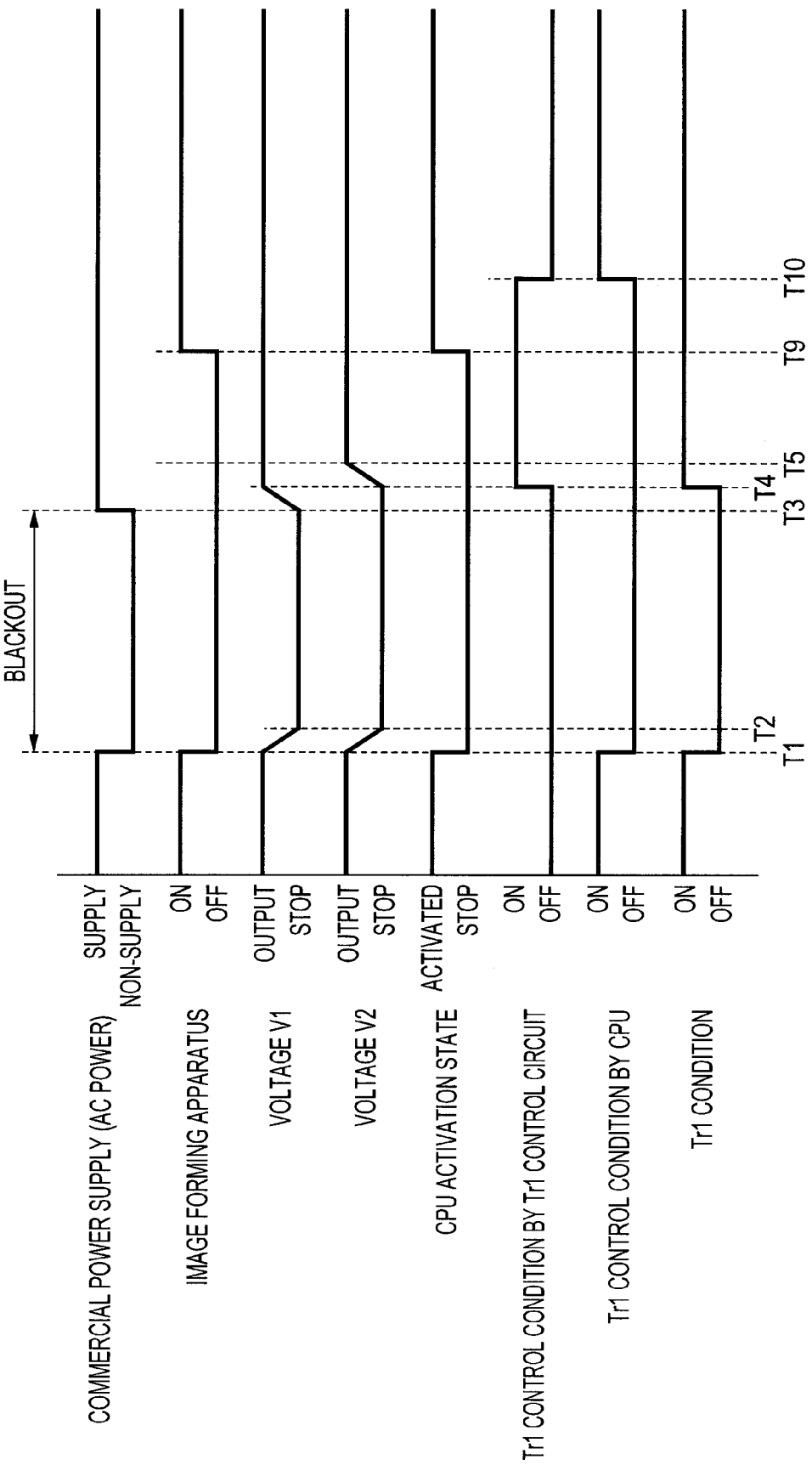
FIG. 8 is a timing chart indicating an operating state of an image forming apparatus according to Embodiment 2 before and after a power failure where the image forming apparatus was in a turn-on-state of a power before the power failure.
Figure 9:
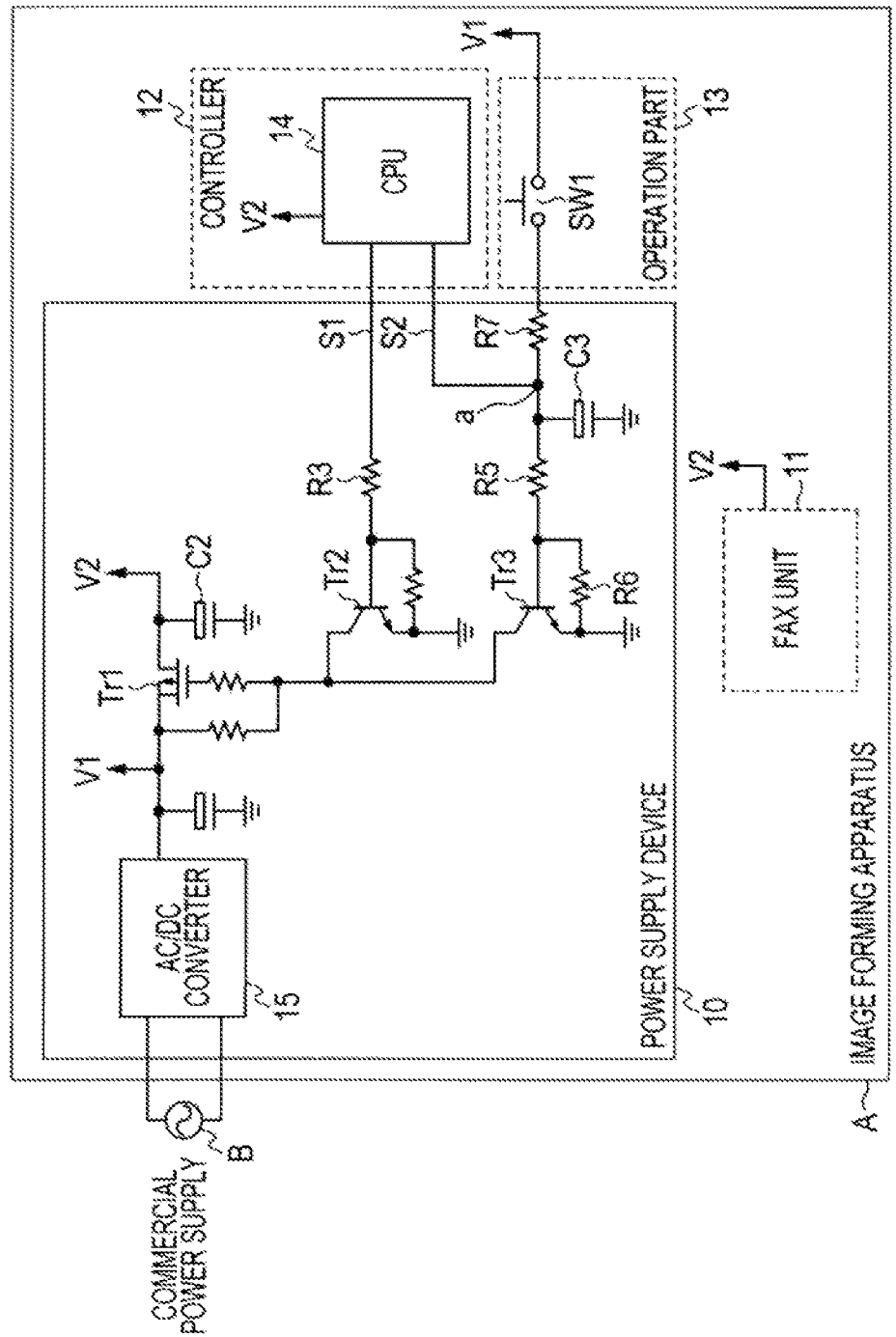
FIG. 9 is a block diagram of an image forming apparatus with a conventional soft-switch power supply device incorporated therein.

Next, an operation of the image forming apparatus at the time of recovery from a power failure will be described with reference to the timing chart in FIG. 8. In FIG. 8, the image forming apparatus A is in a turn-on-state and a power failure occurs at a time T1. Before the power failure, the voltage sources V1 and V2 are in an output state, and the transistor Tr1 is maintained in an on-state by the CPU 14. The state of the Tr1 control circuit 16's control of the transistor Tr1 is in an off-state.

When the power from the commercial power supply B is shut down at the time T1, the voltage source V1 cannot be generated any longer in the power supply device 10. Accordingly, from the time T1 to a time T2, the potential of the voltage source V1 gradually falls and substantially reaches a ground level at the time T2. Simultaneously with the fall of the potential of the voltage source V1, the potential of the voltage source V2 also falls and substantially reaches a ground level at the time T2. With the fall of the potential of the voltage source V2, the CPU also stops operating, and thus, the on-state of the transistor Tr1 provided by the CPU 14 is cancelled, and thus, the transistor Tr1 transitions to an off-state.

Subsequently, upon recovery from the power failure at a time T3, the power supply device 10 is activated again. From the time T3 to a time T4, the potential of the voltage source V1 gradually rises, and upon the potential of the voltage source V1 becoming stable at the time T4, the voltage source V1 comes into an active state. Upon the voltage source V1 being activated at the time T4, the Tr1 control circuit 16 is activated and performs control to make the transistor Tr1 enter an on-state, thereby the transistor Tr1 entering an on-state, and as a result, the potential of the voltage source V2 gradually rises from the time T4 to a time T5. The potential of the voltage source V2 becoming stable and the voltage source V2 comes into an activate state at the time T5. Subsequently, at a time 9, the CPU 14 is activated, thereby the image forming apparatus A entering an operating state.

In order to maintain the image forming apparatus A in a turn-on-state, the CPU 14 outputs a high level signal to the signal line S1 at a time T10, thereby maintaining the transistor Tr1 in an on-state. The high level signal from the signal line S1 is simultaneously output also to the Tr1 control circuit 16, and as described above, the transistor Tr6 thereby comes into an off-state. Consequently, the transistor Tr1 is released from the control to maintain the transistor Tr1 in the on-state, and the transistor Tr7 is maintained in an on-state, thereby the released state being maintained. Subsequently, the image forming apparatus A starts an initial operation and transitions to an operating state, thereby returning to the state before the power failure.

As described above, as with Embodiment 1, the present embodiment enables provision of a soft-switch image forming apparatus that when power from a commercial power supply is shut down by, e.g., a power failure and then is resumed, returns to a state before the power failure.

The present embodiment is configured so that the CPU 14 can perform the control to cancel the operation of the Tr1 control circuit 16 to make the image forming apparatus to automatically enter a turn-on-state after recovery from a power failure, enabling the CPU 14 to perform control to continue/stop the operation of the image forming apparatus A at a desired timing. Consequently, whether the operation of the image forming apparatus A is continued or stopped can be determined after performing various operations such as making the image forming apparatus A perform an initial sequence operation, and providing notification of errors to a user.

Although in the present embodiment, the Tr1 control circuit 16 is provided in the FAX unit 11, the Tr1 control circuit 16 may be provided in the power supply device 10 or any other unit in the image forming apparatus A.

Furthermore, although in embodiments 1 and 2, the present invention has been described taking an image forming apparatus as an example, the present invention is applicable not only to image forming apparatuses, but also to electronic apparatuses in general.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-018808, filed Jan. 29, 2010, which is hereby incorporated by reference herein in its entirety.

What is claimed is:

1. An electronic apparatus comprising:
 a power switch for starting up or shutting down the electronic apparatus;
 a direct-current voltage generation part that outputs a direct-current voltage;
 a control part that controls an operation of the electronic apparatus;
 a switching part that switches between an on-state in which the direct-current voltage from the direct-current voltage generation part is supplied to the control part and an off-state in which the direct-current voltage is not supplied to the control part; and
 a power supply maintaining part that maintains the switching part in the on-state during a predetermined period in a case where the alternating current voltage is supplied,
 wherein in a case where the direct-current voltage is supplied to the control part by maintaining the switching part in the on-state, the control part detects whether the power switch is the on-state or the off-state, and
 wherein in a case where the power switch is on, the control part controls the power supply maintaining part to maintain the switching part in the on-state, and in a case where the power switch is off, the control part controls the power supply maintaining part to maintain the switching part in the off-state.

2. An electronic apparatus according to claim 1, further comprising:
 a memory that stores information regarding an operation status of the electronic apparatus,
 wherein in a case where the information is stored in the memory, the control part controls the switching part so that the switching part is in off-state, and in a case where the information is not stored in the memory, the control part controls the switching part so that the switching part is in on-state.

3. A power supply device according to claim 1, wherein the electronic apparatus includes an image forming apparatus.

4. An electronic apparatus comprising:
 a power switch for starting up or shutting down the electronic apparatus;
 a direct-current voltage generation part that outputs a direct-current voltage;
 a switching part that switches between an on-state in which the direct-current voltage from the direct-current voltage generation part is output, and an off-state in which the output of the direct-current voltage is shut down; and
 a power supply maintaining part that maintains the switching part in the on-state during a predetermined period in a case where an alternating current is supplied,
 wherein in a case where the direct-current voltage is supplied to a control part by maintaining the switching part in the on-state, the control part detects whether the power switch is the on-state or the off-state, and
 wherein in a case where the power switch is on, the control part controls the power supply maintaining part to maintain the switching part in the on-state, and in a case where the power switch is off, the control part controls the power supply maintaining part to maintain the switching part in the off-state.

5. An electronic apparatus according to claim 4, further comprising:
 a memory that stores information regarding an operation status of the electronic apparatus,
 wherein in a case where the information is stored in the memory, the switching part is in the off-state, and in a case where the information is not stored in the memory, the switching part is in the on-state.

6. A power supply device that supplies power to an electronic apparatus, the power supply device comprising:
 a direct-current voltage generation part that outputs a direct-current voltage;
 a control part that controls an operation of the power supply;

a switching part that switches between an on-state in which the direct-current voltage from the direct-current voltage generation part is supplied to the control part and an off-state in which the direct-current voltage is not supplied to the control part; and a power supply maintaining part that maintains the switching part in the on-state during a predetermined period in a case where the alternating current voltage is supplied, wherein in a case where the direct-current voltage is supplied to the control part by maintaining the switching part in the on-state, the control part detects whether a power switch is the on-state or the off-state, and wherein in a case where the power switch is on, the control part controls the power supply maintaining part to maintain the switching part in the on-state, and in a case where the power switch is off, the control part controls the power supply maintaining part to maintain the switching part in the off-state.

7. A power supply device according to claim 6, wherein the electronic apparatus further comprises:

a memory that stores information regarding an operation of the electronic apparatus, wherein in a case where the information is stored in the memory, the control part controls the switching part so that the switching part is in the off-state, and in a case where the information is not stored in the memory, the control part controls the switching part so that the switching part is in the on-state.

8. A power supply device according to claim 6, wherein the electronic apparatus includes an image forming apparatus.

* * * * *